United States Patent
Havener et al.

(10) Patent No.: US 6,972,551 B2
(45) Date of Patent: Dec. 6, 2005

(54) BEAM PROFILE MONITOR WITH ACCURATE HORIZONTAL AND VERTICAL BEAM PROFILES

(75) Inventors: Charles C. Havener, Knoxville, TN (US); Riad Al-Rejoub, Oak Ridge, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 147 days.

(21) Appl. No.: 10/673,715

(22) Filed: Sep. 29, 2003

(65) Prior Publication Data

US 2005/0068048 A1    Mar. 31, 2005

(51) Int. Cl.$^7$ ............................................ G01N 27/00
(52) U.S. Cl. ..................................... 324/71.3; 324/71.1
(58) Field of Search ...................... 324/71.3, 96, 464, 324/465, 458, 751–3; 250/397

(56) References Cited

U.S. PATENT DOCUMENTS

| | | | |
|---|---|---|---|
| 3,789,298 A | 1/1974 | Bert | ............................ 324/71.1 |
| 4,878,014 A | 10/1989 | Simpson | ..................... 324/71.3 |
| 5,224,137 A * | 6/1993 | Plomgren et al. | ............. 378/10 |

OTHER PUBLICATIONS

"Beam Profile Monitors", Product Bulletin from National Electrostatics Corporation, May 1996, Middleton, WI., 3 pages.

* cited by examiner

*Primary Examiner*—Anjan Deb
*Assistant Examiner*—John Teresinski
(74) *Attorney, Agent, or Firm*—James M. Spicer

(57) ABSTRACT

A widely used scanner device that rotates a single helically shaped wire probe in and out of a particle beam at different beamline positions to give a pair of mutually perpendicular beam profiles is modified by the addition of a second wire probe. As a result, a pair of mutually perpendicular beam profiles is obtained at a first beamline position, and a second pair of mutually perpendicular beam profiles is obtained at a second beamline position. The simple modification not only provides more accurate beam profiles, but also provides a measurement of the beam divergence and quality in a single compact device.

2 Claims, 3 Drawing Sheets

BEAM PROFILE MONITOR WITH ACCURATE HORIZONTAL AND VERTICAL BEAM PROFILES

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

FIELD OF THE INVENTION

The invention relates to beam profile scanners used with high and low energy ion, electron and neutral beams. More particularly, it relates to scanners that produce one pair of mutually perpendicular scan profiles of the beam. The scanner of this invention produces not one but two pairs of mutually perpendicular scan profiles, with each pair of scan profiles obtained at a different position along the beam axis.

BACKGROUND OF THE INVENTION

Rotating wire scanners are used at most accelerator facilities to monitor ion and neutral particle beams in real time, and they are also used to tune the beams.

A popular scanner is the National Electrostatic Corporation (NEC) Model BPM-80 Beam Profile Monitor. It uses a single helically-shaped wire probe which is rotated in and out of the beam to give a pair of scan profiles, one horizontal and one vertical. The scanner produces an electrical signal which is proportional to the line-integrated horizontal and vertical profiles of the beam. The horizontal and vertical profiles are viewed in real time on an oscilloscope and provide a composite profile of the beam. Alternatively or additionally, the profiles can be digitized for a more quantitative analysis of the beam.

The Model BPM-80 scanner uses a single helical wire mounted at one end of a two-inch bar. Scan profiles are produced by collecting the electrons emitted from the wire as it passes through the beam. The center of the bar is attached to a rotatable shaft. The bar is oriented to the beamline such that as the bar rotates, the wire is moved in and out of the beam, producing a horizontal and then a vertical scan of the beam. In the Model BPM-80, the horizontal profile of the beam is taken a distance along the beamline of about 2 inches from the vertical profile, as fixed by the length of the two-inch bar.

One disadvantage of the separation between the horizontal and vertical scan measurements is that the efficiency of electron collection from the rotating wire can be different at the two different positions along the beam. Thus, in the conventional wire scanner, this difference leads to horizontal and vertical profiles which are not normalized to each other. Another disadvantage, which can be very serious for low energy beam applications, is that the beam can change significantly over the 2-inch distance between where the horizontal and vertical profiles are taken. This results in an inaccurate composite profile of converging or diverging beams.

In this invention, we mount two helical wires on a rotating bar so that the two wires are moved in and out of the beam. This produces two pairs of horizontal and vertical profiles. Due to the manner in which we mount the two wire probes on the bar, one pair of horizontal and vertical profiles is correlated to one position along the beam axis, and the other pair of horizontal and vertical profiles is correlated to a different position along the beam axis. The two pairs of profiles can be used to measure the beam divergence and quality. Our simple modification to a rotating wire scanner provides more accurate beam profiles at two different positions along the beam, providing a measurement of the beam divergence and quality in a single compact device.

REFERENCES

1. "Beam Profile Monitors", Product Bulletin, National Electrostatics Corporation, May 1996, 3 pages.
2. U.S. Pat. No. 3,789,298, issued Jan. 29, 1974, "Beam Scanner", R. G. Herb.
3. U.S. Pat. No. 4,878,014, issued Oct. 31, 1989, "Ion Beam Profile Scanner Having Symmetric Detector Surface to Minimize Capacitance Noise", M. L. Simpson.

OBJECTS OF THE INVENTION

It is a first object of this invention to add a second helical wire probe to a helical wire beam profile scanner such that the two helical wire probes produce two pairs of horizontal and vertical profiles in a single 360 degree scan of the beam.

Another object of the invention is to minimize electron collection efficiency errors over beam profile scanners that obtain a single pair of mutually perpendicular beam profiles, but are incapable of obtaining them at same position along the beam axis.

A further object of the invention is to provide two pairs of horizontal and vertical beam profiles at two different positions along the beam axis, allowing the measurement of the beam divergence and quality in a single compact beam profile monitor.

BRIEF SUMMARY OF THE INVENTION

In one embodiment, an energetic particle beam profile scanner has a probe constructed of a material that emits electrons when struck by the particle beam, a detection means for detecting the electrons emitted from the probe, and drive means for passing the probe through the particle beam at first and second positions along the particle beam axis. The probe provides two mutually perpendicular scans of the particle beam. The profile scanner further comprises a second probe constructed of a material that emits electrons when struck by the particle beam, the detection means is capable of detecting the electrons emitted from the second probe, and the drive means is capable of passing the second probe through the particle beam at the first and second positions along the particle beam axis. The second probe provides two additional mutually perpendicular scans of the particle beam, such that two mutually perpendicular beam scans are obtained at the first position along the particle beam axis, and two mutually perpendicular beam scans are obtained at the second position along the particle beam axis.

In a further embodiment of the above described particle beam profile scanner, the probe and second probe are mounted spaced apart on the drive means.

In another embodiment of the above described particle beam profile scanner, the probe and the second probe are jointly mounted on the drive means.

BRIEF DESCRIPTION OF THE DRAWINGS

1a shows the rotation of the single wire through a beam traveling in the +z direction. FIG. 1b shows the signal (electrons emitted from the wire) as the wire is rotated, scanning vertically through the beam at $z_1$ and then horizontally at $z_2$.

FIG. 2a shows the rotation of two wires through the beam which is traveling in the +z direction. FIG. 2b shows the signal (electrons emitted from the wire) as the two wires are rotated into the beam, scanning the beam horizontally at $z_1$, vertically at $z_1$, vertically at $z_2$ and then horizontally at $z_2$.

DETAILED DESCRIPTION OF THE INVENTION

Figure 1:
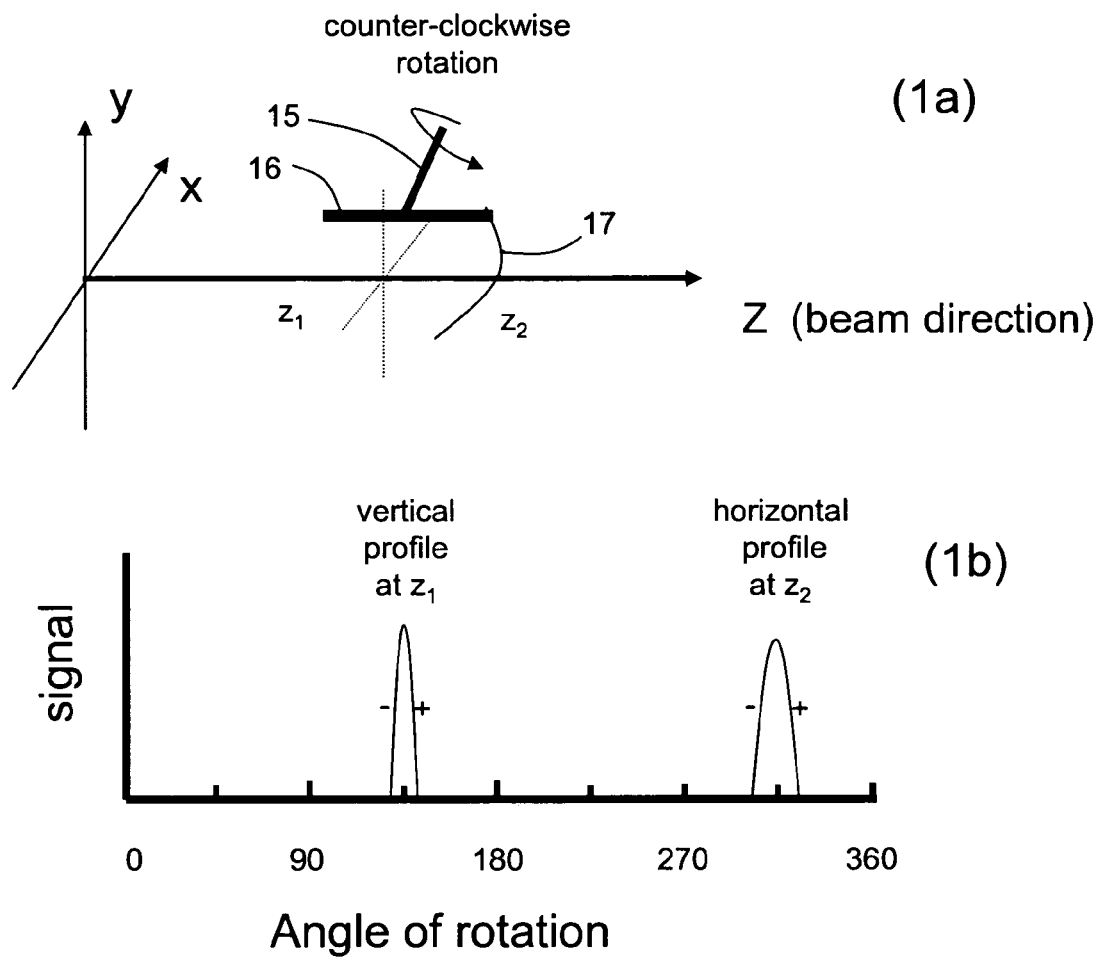
FIG. 1 illustrates the operation of a conventional rotating wire scanner, as typified in the NEC Model BPM-80. FIG.

FIG. 1 illustrates the principle of operation of a commercially available rotating wire scanner as typified in the NEC Model BPM-80. As described in the NEC manual, a single wire (17) formed into a 45° helix is rotated about the axis of the helix with the axis inclined at 45° with respect to the vertical in a plane (XY) perpendicular to the direction of the beam. The wire is mounted on a bar 16 as illustrated in FIG. 1a. The unattached end of the wire is directed toward the center and goes into the plane of the paper. The bar is rotated counter-clockwise as viewed from above the rotation axis. Every full cycle of rotation (360°) results in the wire passing through the beam in two orthogonal directions (this can not be seen easily from the sketch due to the three dimensional aspect of the motion). The electrons emitted from the wire each time it passes through the beam is collected and the resultant signal (see FIG. 1b) corresponds to the vertical profile at $z_1$ and the horizontal profile at $z_2$. During the vertical scan the wire passes through the beam from $-y$ to $y$ and the sides of the resultant vertical profile are labeled by the corresponding – or +. During the horizontal scan the wire passes through the beam from $-x$ to $+x$ and the sides of the resultant horizontal profile are also labeled (see FIG. 1b). In this illustration the beam which is traveling along the +z direction is centered on the z axis and the 0° angle of rotation is set to when the mounting bar is parallel to the z axis, as shown in FIG. 1a. The NEC scanner produces electronic fiducials (not shown) to denote the beginning of a scan, the center of the vertical scan, and the center of the horizontal scan, which in this illustration, are at 135° and 315° in the rotation.

The problems with rotating wire scanners of the above type are that the x and y profiles are measured at two different locations, $z_1$ and $z_2$. This can lead to inaccuracies due to: 1. the efficiency of measuring the electron signal at $z_1$ and $z_2$ can be different which results in a different normalization for each profile. 2. The beam can change as a function of z (especially for low energy beams) resulting in an x and y profile which does not accurately reflect the profiles of the beam at any position. This makes the profiles hard to interpret. For example, in FIG. 1 the different profiles shown at $z_1$ and $z_2$ seem to indicate that the beam has a narrower vertical profile than horizontal but this interpretation would complicated by a beam, e.g., which is divergent, increasing in width from $z_1$ to $z_2$.

Figure 2:
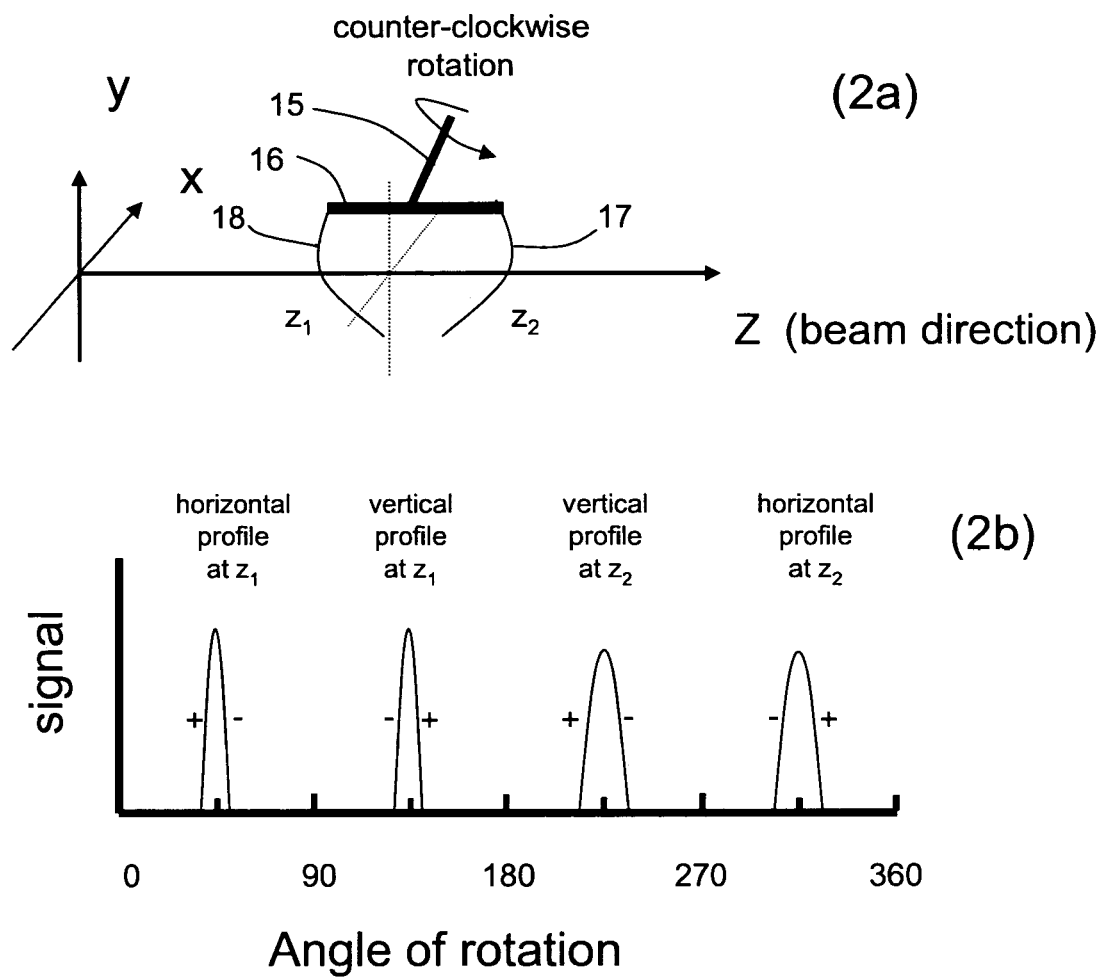
FIG. 2 illustrates a simple modification to the NEC scanner in accordance with our invention.

In the present invention, illustrated in FIG. 2, we add a second helix shaped wire 18 at the other end of the bar 16 oriented as shown. (The unattached end of both wires is directed toward the center and goes into the paper. In the plane perpendicular to the mounting bar, the two wires 17, 18 are a mirror image of each other.) Since only one of the wires actually passes through the beam every 90° of rotation, the signals from the different wires do not interfere with each other. The additional wire 18 results in two additional profiles, i.e., a horizontal profile at $z_1$ and a vertical profile at $z_2$. The two wires give orthogonal scans (both x and y) of the beam at each of the locations $z_1$ and $z_2$ during each 360° rotation. Horizontally, the additional wire passes through the beam from $+x$ to $-x$ and vertically from $+y$ to $-y$ and is so labeled in FIG. 2b. For a beam centered on the z axis, the horizontal profile at $z_1$ is centered at 45° into the rotation, the vertical profile at $z_1$ is centered at 135° into the rotation, the vertical profile at $z_2$ is centered at 225° into the rotation, and the horizontal profile at $z_2$ is centered at 315° into the rotation.

In the operation of the invention, as in the original NEC scanner, electrons emitted from the wire 18 are collected in a cylindrical shroud and fed into a current amplifier. When the output of the amplifier is fed into an oscilloscope the signal can be displayed as a function of time. By triggering on the electronic fiducials also supplied by the NEC scanner, one may view the profiles just as shown in FIG. 2b with the angle of rotation replaced by a time axis. In the illustration of FIG. 2, the first two peaks give the vertical and horizontal beam profiles at $z_1$. At $z_1$ the beam is scanned horizontally from $+x$ to $-x$ or right to left as viewed into the beam. At $z_1$ the beam is scanned vertically from bottom to top. The last two profiles give the horizontal and vertical profiles at $z_2$ where vertically the beam is scanned top to bottom and horizontally left to right. Comparing the profiles at $z_1$ and $z_2$ it is clear that the beam in this illustration is divergent, with the horizontal and vertical profiles identical at each position. This information is not obtainable from a single wire scanner. Using an oscilloscope, the profiles of the beams can be viewed in "real time" as one tunes the beam. For a more detailed analysis of the beam profiles, the signal can be digitized as a function of time and then fed into a computer. For easier analysis of any offsets or non-symmetric beams, once digitized, the horizontal and vertical profiles can be displayed with the same orientation, i.e., left to right, or bottom to top.

Our modification provides a more accurate profile of the beam since, for the first time, horizontal and vertical profiles are obtained at the same position in the beam, and thus can be directly compared to each other. These profiles are more accurate than with the prior scanner because each pair of horizontal and vertical profiles are measured at the same position and have the same electron collection efficiency. For low energy beams, where the profile of the beam can change within a relatively short distance, the two pairs of horizontal and vertical profiles are inherently more accurate, and can be used to measure the divergence and quality of the beam.

Figure 3:
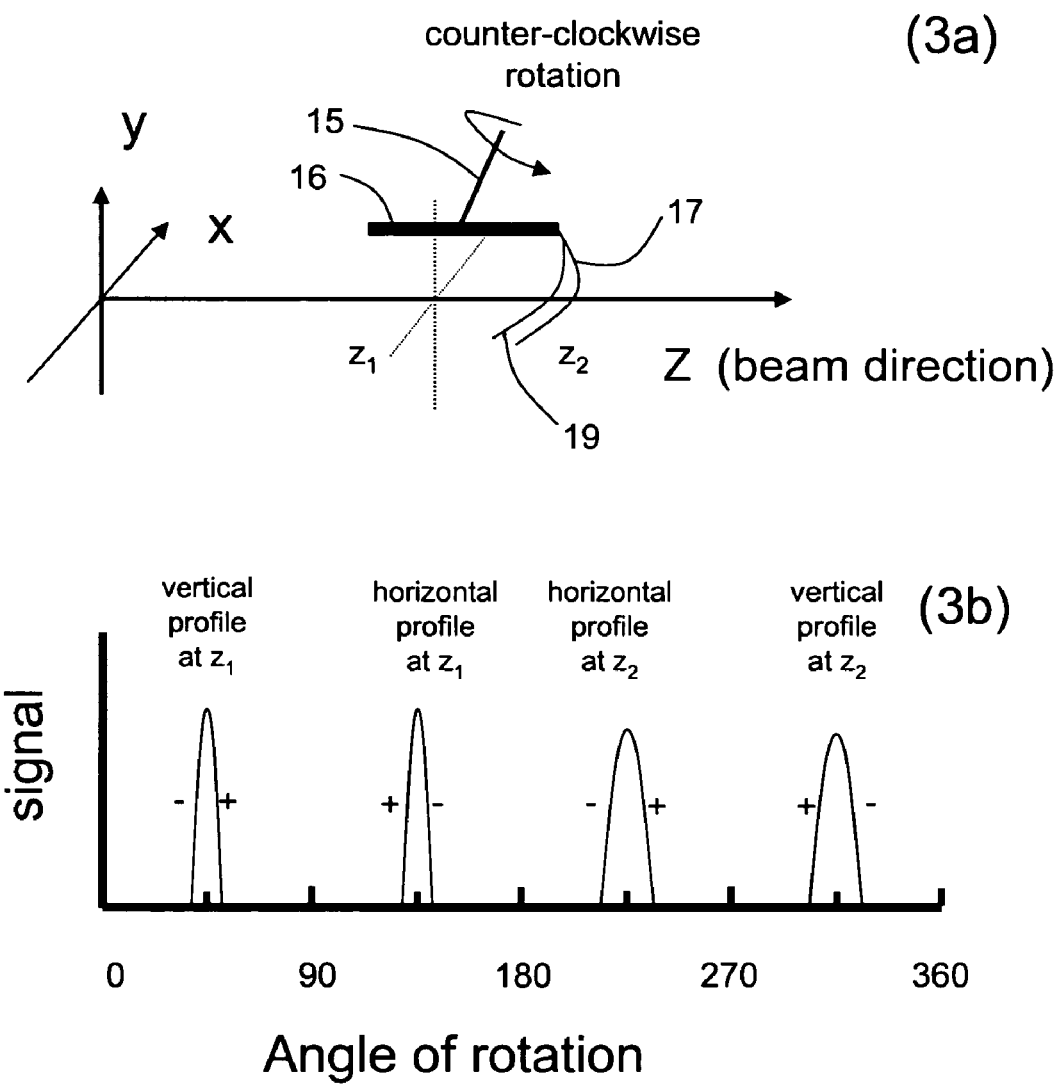
FIG. 3 illustrates a recent dual wire scanner as typified by the NEC Beam Profile Monitor Model BPM280. The two wires mounted at the end of the mounting bar (FIG. 3a) provide the horizontal and vertical scans shown in FIG. 3b.

FIG. 3 illustrates a recent dual wire scanner, as typified by the NEC Model BPM280. A second helix shaped wire 19 is added to the same end of the bar 16 as the first wire 17, however with the unattached end of the wire extending out of the paper rather than into the paper like the "original" first wire. The actual mounting of the wire is not significant as long as the wires are not in the beam at the same time. The wires perform scans as the bar 16 is rotated. The wires are mounted in an opposite orientation such that the additional wire does not give identical scans as the first wire. FIG. 3b shows the beam profiles from the Model BPM280, showing the same information as our modification to the original NEC profile monitor.

While there has been shown and described what are at present considered the preferred embodiments of the invention, it will be obvious to those skilled in the art that various changes and modifications can be prepared therein without departing from the scope of the inventions defined by the appended claims.

We claim:

1. In an energetic particle beam profile scanner having a probe constructed of a material that emits electrons when struck by the particle beam, a detection means for detecting the electrons emitted from the probe, and drive means for rotating the probe about an axis such that the probe passes through the particle beam at first and second positions along the particle beam axis, and wherein the probe provides two mutually perpendicular scans of the particle beam, the profile scanner further comprising:

a second probe constructed of a material that emits electrons when struck by the particle beam, said detection means capable of detecting the electrons emitted from said second probe, said drive means capable of rotating said second probe about said axis such that said second probe passes through the particle beam at said first and second positions along the particle beam axis, said second probe providing two additional mutually perpendicular scans of the particle beam, such that two mutually perpendicular beam scans are obtained at said first position along the particle beam axis, and two mutually perpendicular beam scans are obtained at said second position along the particle beam axis.

2. The particle beam profile scanner of claim 1 wherein said probe and said second probe are mounted spaced apart on said drive means.

* * * * *